United States Patent
Arrigoni

(10) Patent No.: US 11,437,309 B2
(45) Date of Patent: Sep. 6, 2022

(54) METHOD OF MANUFACTURING SEMICONDUCTOR DEVICES AND CORRESPONDING SEMICONDUCTOR DEVICE

(71) Applicant: STMicroelectronics S.r.l., Agrate Brianza (IT)

(72) Inventor: Alberto Arrigoni, Como (IT)

(73) Assignee: STMicroelectronics S.r.l.

( * ) Notice: Subject to any disclaimer, the term of this patent is extended or adjusted under 35 U.S.C. 154(b) by 0 days.

(21) Appl. No.: 16/906,425

(22) Filed: Jun. 19, 2020

(65) Prior Publication Data
US 2020/0402900 A1 Dec. 24, 2020

(30) Foreign Application Priority Data
Jun. 20, 2019 (IT) .................. 102019000009585

(51) Int. Cl.
*H01L 23/498* (2006.01)
*H01L 21/48* (2006.01)
*H01L 23/495* (2006.01)

(52) U.S. Cl.
CPC .... *H01L 23/49833* (2013.01); *H01L 21/4828* (2013.01); *H01L 21/4853* (2013.01); *H01L 23/49541* (2013.01); *H01L 23/49586* (2013.01); *H01L 23/49877* (2013.01)

(58) Field of Classification Search
CPC .... H01L 21/4821–4882; H01L 23/488–49894
See application file for complete search history.

(56) References Cited

U.S. PATENT DOCUMENTS

| 5,121,187 | A | * | 6/1992 | Yamazaki | ........... H01L 23/3142 257/666 |
| 6,025,640 | A | * | 2/2000 | Yagi | ................ H01L 21/4828 257/666 |
| 7,830,024 | B2 | * | 11/2010 | Kim | ................... H01L 21/568 257/784 |
| 8,129,229 | B1 | * | 3/2012 | Sirinorakul | ....... H01L 23/49582 438/123 |
| 2004/0207056 | A1 | * | 10/2004 | Seki | ..................... H01L 24/48 257/676 |
| 2006/0051894 | A1 | * | 3/2006 | Liu | ..................... B23K 3/0623 438/108 |

FOREIGN PATENT DOCUMENTS

| JP | H0590475 A | 4/1993 |
| JP | H06177304 A | 6/1994 |
| JP | H09148509 A | 6/1997 |
| JP | 2002231871 A | 8/2002 |
| JP | 2009260280 A | 11/2009 |

OTHER PUBLICATIONS

IT Search Report and Written Opinion for IT Appl. No. 102019000009585 dated Mar. 13, 2020 (8 pages).

* cited by examiner

*Primary Examiner* — Andres Munoz
(74) *Attorney, Agent, or Firm* — Crowe & Dunlevy

(57) ABSTRACT

A leadframe for a semiconductor device includes an array of electrically-conductive leads. The electrically-conductive leads have mutually opposed lateral (vertical) surfaces. An electrically-insulating material is formed over the mutually lateral opposed surfaces to prevent short circuits between adjacent leads. The electrically-insulating material may further be provided at one or more of the opposed bottom and top surfaces of the electrically-conductive leads of the leadframe.

7 Claims, 2 Drawing Sheets

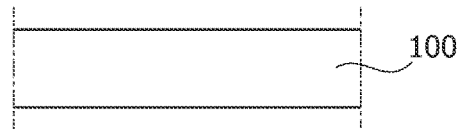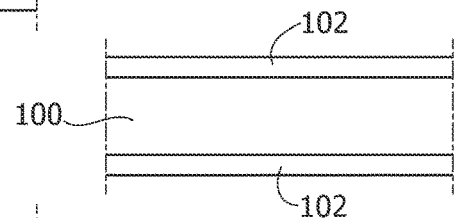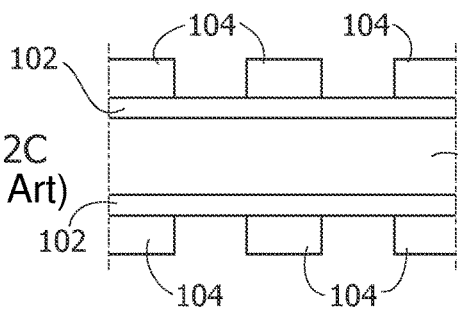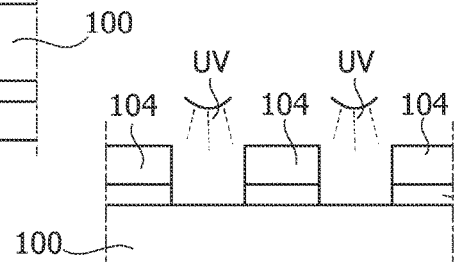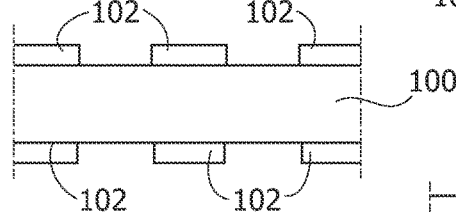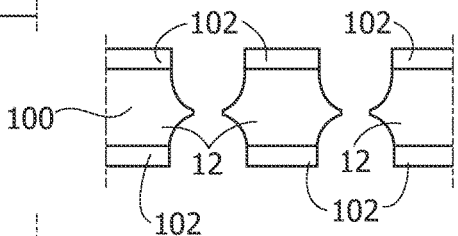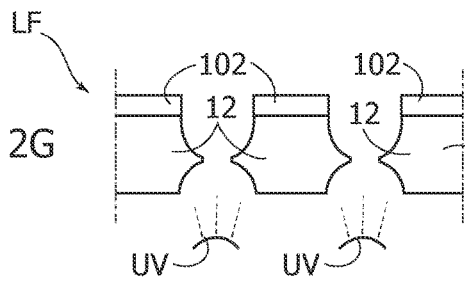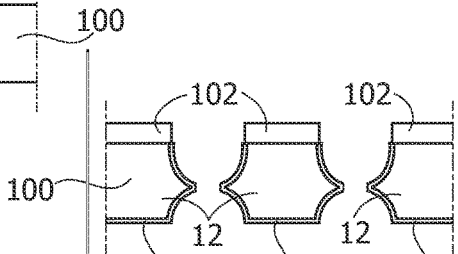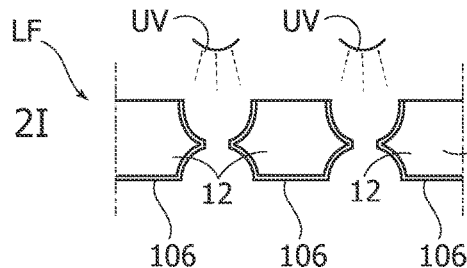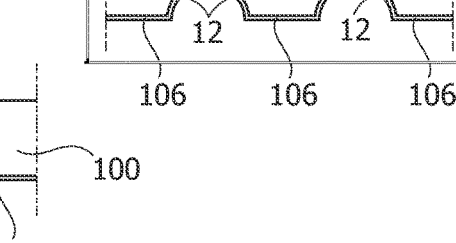

METHOD OF MANUFACTURING SEMICONDUCTOR DEVICES AND CORRESPONDING SEMICONDUCTOR DEVICE

PRIORITY CLAIM

This application claims the priority benefit of Italian Application for Patent No. 102019000009585, filed on Jun. 20, 2019, the content of which is hereby incorporated by reference in its entirety to the maximum extent allowable by law.

TECHNICAL FIELD

The description relates to manufacturing semiconductor devices. One or more embodiments may be applied to manufacturing semiconductor devices such as integrated circuits (ICs), for instance.

BACKGROUND

Various technologies are currently available for manufacturing semiconductor devices including a leadframe.

The designation "leadframe" (or "lead frame") is currently used (see for instance the USPC Consolidated Glossary of the United States Patent and Trademark Office) to indicate a metal frame which provides support for an integrated circuit chip or die as well as electrical leads to interconnect the integrated circuit in the die or chip to other electrical components or contacts. Essentially, a leadframe comprises an array of electrically-conductive formations (leads) which from an outline location extend inwardly in the direction of a semiconductor chip or die thus forming an array of electrically-conductive formations from a die pad configured to have at least one semiconductor chip or die attached thereon. Countering undesired lead misplacement (shifting/tilting/lifting) that might occur during package molding or other material handling steps is a desirable goal to pursue. More to the point, the capability of avoiding undesired electrical contact (short-circuit) between adjacent leads or wires as possibly induced by such displacement will represent a highly desirable feature.

There is accordingly a need in the art to contribute in providing improved solutions to counter such undesired electrical contact.

SUMMARY

One or more embodiments relate to a corresponding semiconductor device: a semiconductor device of the QFP (Quad Flat Pack) type and other types of semiconductor devices—with high pin count, for instance—may be exemplary of such a device.

One or more embodiments facilitate electrical insulating the vertical sides (and possibly the bottom side) of leads in a leadframe.

In one or more embodiments, selectivity can be achieved by coating the leadframe (by dipping in a chemical bath, for instance) with electrically-insulating material such as copper oxide or an OSP-like material, OSP being an acronym for organic solderability-preserving.

One or more embodiments may facilitate co-integration of masking-coating with current leadframe masking/etching process steps.

In one or more embodiments an electrically-insulating layer can be provided having high temperature resistance ($T_{peak}$) in the range of 265° C., which facilitates compatibility with MSL (Moisture Sensitivity Level) reflow.

One or more embodiments may provide a good adhesion to leadframe bulk material (a copper alloy, for instance) and to package molding compound (epoxy molding compound or EMC, for instance).

One or more embodiments may use CuOx (copper oxide) or OSP (benzotriazoles/imidazoles/benzimidazoles-based) materials; also silicon-based compounds may be suitable to provide layers/coatings in embodiments.

BRIEF DESCRIPTION OF THE DRAWINGS

One or more embodiments will now be described, by way of example only, with reference to the annexed figures, wherein:

FIGS. 2A to 2I are exemplary of possible steps of a method of manufacturing.

DETAILED DESCRIPTION

Figure 1:
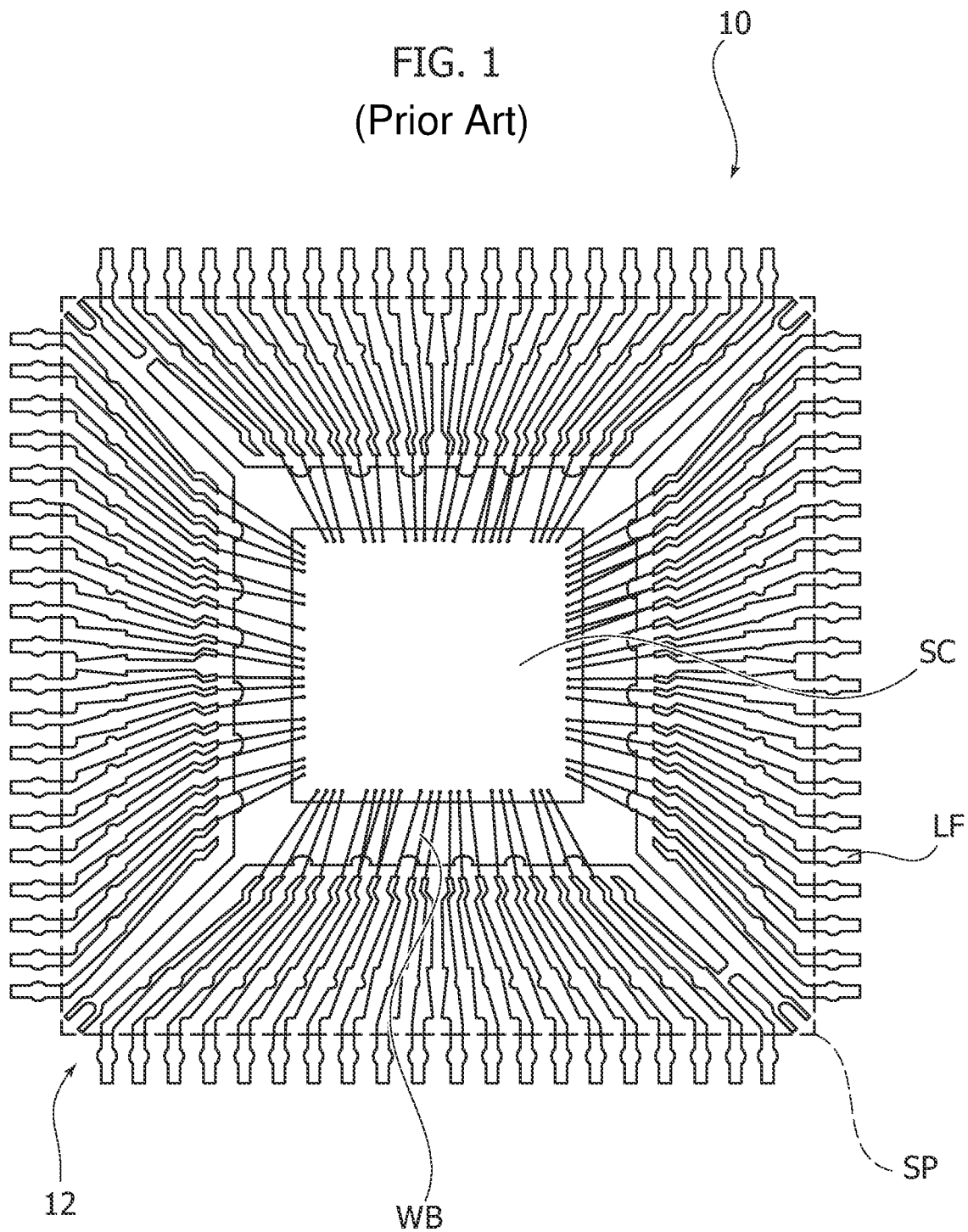
FIG. 1 is an exemplary representation of a semiconductor product to which embodiments may apply.

It will be appreciated that, for the sake of clarity and ease of representation, the various figures may not be drawn to a same scale.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

FIG. 1 is exemplary of a possible structure of a semiconductor device 10 (an integrated circuit or IC, for example) comprising a leadframe LF. The leadframe LF may in turn comprise an array of electrically-conductive leads 12 extending radially from a (central, for instance) die pad configured to have at least one semiconductor chip or die SC attached thereon.

As exemplified in FIG. 1, the semiconductor chip or die SC may be electrically coupled to the leads 12 in the leadframe LF via electrically-conductive formations such as a wire bonding pattern WB. A package molding compound (an epoxy molding compound (EMC), for instance) can be molded as indicated in dashed lines at SP to complete the structure of the semiconductor device 10.

A structure as exemplified in FIG. 1 is conventional in the art, which makes it unnecessary to provide a more detailed description herein.

This applies, for example, to the possibility of providing a wide variety of geometrical patterns for the leadframe LF, adopting different electrical coupling arrangements (bumps, for instance) of the semiconductor chip or die SC to the leads 12 in the leadframe LF, and so on.

As discussed, arrangements as exemplified in FIG. 1 may suffer from quality/reliability issues, this being particularly the case for high-pin count Quad Flat Package (QFP) packages. Such quality/reliability issues may be related to undesired displacement (shifting/tilting/lifting) of leads 12 in the leadframe LF (at the inner ends, for instance) during manufacturing steps such as, for instance, molding of the package material SP or other material handling steps. Such displacement may result in leads 12 in the leadframe being shifted/tilted/lifted towards an adjacent lead or wire which in turn may generate the risk of undesired electrical contact (short circuit) between different input/output lines.

A conventional approach to counter such undesired displacement includes applying onto the leads 12 in the leadframe LF a so-called lead locking tape (LLT).

LLT was found to represent an effective solution to counter the risk of inner lead shifting/tilting/lifting with the capability of holding the leads firmly in their original (and expected) position.

A drawback of the LLT technique is related to cost. Depending on the leadframe topology, applying LLT may result in an increase in the leadframe cost in a range between 20% and 60%.

Other drawbacks of LLT may be related to other factors. For instance an LLT can hardly be applied on copper (irrespective of rough or not rough) when high-voltage (>10 volt) operating conditions are expected. A possible explanation of this may lie in the risk of copper dendrite growth in the adhesive layer of LLT.

This was found to lead to pin-to-pin electrical leakage or short-circuit in packages exposed to high temperatures and humidity, for instance in a biased environment (such as may be the case for a temperature humidity bias or THB test).

Additionally, LLT was found to be hardly applicable in circumstances where physical space is limited (in the presence of a large die-pad size or for certain die-pad form factors, for instance), which militates against the possibility of placing the locking tape in place.

By way of contrast to such an approach, rather than aiming at countering lead displacement (shifting/tilting/lifting) per se, one or more embodiments primarily aim at countering the risk of electrical short-circuits between adjacent leads/wires. For instance, one or more embodiments may provide for the "vertical" (mutually opposed) sides of adjacent leads 12—and possibly the bottom side of the leads 12—being covered by electrically-insulating material. Such a covering or coating may be provided by mechanical or photo masking of the top (front) leadframe surface at the beginning of the assembly process flow. Such an action can be performed during leadframe manufacturing (at a supplier facility for instance).

FIGS. 2A to 2I are exemplary of a—non mandatory—sequence of manufacturing steps in accordance with embodiments.

FIG. 2A is exemplary of the provision of a base layer 100 for the leadframe (this may include metal material such as Cu alloy material) having opposed first and second surfaces.

FIG. 2B is exemplary of the deposition of a (conventional) resist material 102 on both opposed surfaces of the base material 100.

FIG. 2C is exemplary of mechanical/photo masking 104 applied (again in a conventional manner) to the resist material 102 according to a desired pattern for the leadframe (LF in FIG. 1).

FIG. 2D is exemplary of partial removal of the (photo) resist 102 (by UV exposure, for instance, on both sides of the leadframe) at those portions left uncovered by the masking 104.

FIG. 2E is exemplary of removal of the mask material 104. Such a mask may be a solid piece, of glass-like material, for instance and can be mechanically coupled to the leadframe material 100 and then mechanically removed. A same mask material can thus be re-used in production, even for a long time.

FIG. 2F is exemplary of the base material 100 being etched away (by a chemical bath, for instance) other than at those portions covered by the resist material in order to provide a desired layout for the leadframe LF.

In that way, a leadframe LF is provided comprising an array of leads 12, wherein these leads exhibit:
  mutually opposed lateral (or "vertical") surfaces therebetween; as shown, as a result of being formed—for instance—by a chemical etching process, these surfaces may exhibit a spacing therebetween which is larger at the opposed surfaces of the base material 100 and narrower intermediate these opposed surfaces with an approximately hourglass-like cross section; and
  opposed front and back (top and bottom) surfaces at the opposed surfaces of the base material 100.

FIG. 2G is exemplary of removal of the photo resist material 102 (via exposure to UV radiation, for instance), optionally only from the bottom (back) side of the leadframe LF.

FIG. 2H is exemplary of electrically-insulating material 106 (for example, a layer) as discussed previously being formed (by dipping in a bath of such material, for instance) over the mutually opposed (lateral) surfaces of the leads formed in the base material 100 as well as over the bottom (back) surface of the leadframe LF.

FIG. 2I is exemplary of removal of the photo resist material 102 (via exposure to UV radiation, for instance) from the top (front) surface of the leadframe LF.

As noted, the manufacturing steps exemplified by FIGS. 2A to 2F may be regarded as conventional in the art. The manufacturing steps exemplified by FIG. 2G and FIG. 2H are intended to facilitate the provision of an electrically-insulating layer or coating 106 at the mutually opposed (lateral) sides of the leads in the leadframe LF and at the bottom (back) surfaces of the leads in the leadframe LF.

The manufacturing steps of FIGS. 2G and 2I can be regarded as per se conventional in the art save that, in one or more embodiments as exemplified herein, such steps are not performed at a same time, but rather in two subsequent steps with formation of the electrically-insulating layer or coating 106 (at the mutually opposed lateral sides and at the bottom surfaces of the leads) occurring intermediate these steps.

In one or more embodiments, the manufacturing step exemplified in FIG. 2G can be "skipped" with the electrically-insulating material 106 formed (by dipping into a bath, for instance) only over the mutually opposed lateral surfaces of the leads in the leadframe LF and the photo resist material 102 removed from both opposed surfaces of the leadframe LF after the provision of the electrically-insulating material 106.

In one or more embodiments, the electrically-insulating material 106 may be formed over the mutually opposed lateral surfaces of the leads in the leadframe LF as well as at both the top (front) and bottom (back) surfaces of the leadframe LF. In that case, the photo resist material 102 can be removed from both opposed surfaces of the leadframe LF prior to forming the electrically-insulating material 106 (by dipping into a bath, for instance).

Whatever the option adopted, in one or more embodiments the further electrically-insulating material 106 formed at one or both the opposed front and back surfaces of the leadframe LF may extend continuously—that is, without gaps or breaks—with the electrically-insulating material 106 formed over the mutually opposed lateral surfaces of the leads 12.

It is noted that, whatever the option adopted, providing the electrically-insulating material 106 may involve dipping the leadframe (possibly having resist material 102 still left in place on either or both surfaces of the leadframe) into a chemical bath.

One or more embodiments may provide quality/reliability improvements, for instance, in those cases where LLT technique cannot be applied.

Also, one or more embodiments may facilitate avoiding electrical contact (electrical short-circuit) between adjacent leads/wires even in the presence of possible displacement produced during manufacturing steps leading to lead-to-lead abutment or lead-to-wire contact.

One or more embodiments may facilitate achieving notable cost savings in comparison with LLT techniques.

One or more embodiments may be easily applied to current leadframe manufacturing processes.

One or more embodiments may provide deposition of electrically-insulating material only over selected parts of the leadframe LF.

A method as exemplified herein may comprise:
providing a leadframe (for instance, LF produced with the steps of FIGS. 2A to 2F) for a semiconductor device (for instance, 10), the leadframe comprising an array of electrically-conductive leads, the electrically-conductive leads in said array of electrically-conductive leads having mutually opposed lateral (or "vertical") surfaces, wherein the method comprises forming (a layer of) electrically-insulating material (for instance, 106) over said mutually opposed lateral surfaces.

In a method as exemplified herein, with the leadframe having opposed front and back surfaces, the method may comprise forming (a layer of) further electrically-insulating material over at least one of said opposed front and back surfaces, optionally (only) over the back surface, of the leadframe.

In a method as exemplified herein, said further electrically-insulating material over at least one of said opposed front and back surfaces of the leadframe may extend continuously with said electrically-insulating material (for instance, 106) over said mutually opposed lateral surfaces.

A method as exemplified herein may comprise forming (a layer of) electrically-insulating material over said mutually opposed lateral surfaces and the back surface of the leadframe while leaving the front surface of the leadframe exempt from said electrically-insulating material.

In a method as exemplified herein, the electrically-insulating material may comprise material selected out of: copper oxide, benzotriazoles/imidazoles/benzimidazoles-based materials, and silicon-based materials.

In a method as exemplified herein, forming said electrically-insulating material may comprise dipping the leadframe in a chemical bath of electrically-insulating material.

A method as exemplified herein may comprise:
providing a sheet of electrically-conductive material (for instance, 100) having opposed front and back surfaces,
applying onto said opposed surfaces resist material (for instance, 102) defining a geometrical pattern for said leadframe,
etching said sheet of electrically-conductive material at locations left uncovered by said resist material to produce the leads of said leadframe,
forming said electrically-insulating material over said mutually opposed lateral surfaces of electrically-conductive leads of the leadframe.

A method as exemplified herein may comprise removing (for instance, via UV exposure) said resist material from at least one of said opposed surfaces prior to forming said electrically-insulating material.

A semiconductor device as exemplified herein may comprise:
a leadframe (for instance, LF) comprising an array of electrically-conductive leads extending (away) from a die pad, electrically-conductive leads in said array of electrically-conductive leads having mutually opposed surfaces with electrically-insulating material formed over said mutually opposed surfaces with a method as exemplified herein, and
at least one semiconductor chip or die (for instance, SD) attached on said die pad in said leadframe (with electrical coupling to the leads in the leadframe provided via wire bonding or other conventional means, for instance).

Without prejudice to the underlying principles, the details and embodiments may vary, even significantly, with respect to what has been described by way of example only without departing from the scope of the embodiments.

The extent of protection is determined by the annexed claims.

The claims are an integral part of the technical disclosure of embodiments as provided herein.

The invention claimed is:

1. A method for manufacturing a leadframe for a semiconductor device, wherein the leadframe comprises an array of electrically-conductive leads, wherein the method comprises:
forming openings in a base layer having opposed first and second surfaces to define electrically-conductive leads for said array of electrically-conductive leads which have mutually opposed lateral surfaces extending between the opposed first and second surfaces;
wherein forming openings comprises:
applying resist material onto the opposed first and second surfaces of the base layer made of an electrically-conductive material, said resist material defining a geometrical pattern for said leadframe; and
etching said base layer at locations left uncovered by said resist material to produce the electrically-conductive leads in said leadframe;
removing said resist material from the first surface, but not from the second surface; and
after removing, forming an electrically-insulating material on said mutually opposed lateral surfaces and on the first surface but not on the second surface so that the second surface of each electrically-conductive lead is uncovered.

2. The method of claim 1, wherein forming the electrically-insulating material results in the electrically-insulating material extending continuously over said mutually opposed lateral surfaces and the first surface.

3. The method of claim 1, wherein the electrically-insulating material comprises a material selected from the group consisting of: a copper oxide material, a benzotriazoles-based material, an imidazoles-based material, a benzimidazoles-based material, and a silicon-based material.

4. The method of claim 1, wherein forming the electrically-insulating material comprises dipping the leadframe in a chemical bath of said electrically-insulating material to deposit the electrically-insulating material on the uncovered first surface and mutually opposed lateral surfaces.

5. A method, comprising:
   forming a first resist layer directly on a first surface of a metal layer;
   forming a second resist layer directly on a second surface of the metal layer which is opposed to said first surface;
   patterning the first and second resist layers;
   etching the metal layer at locations not covered by the patterned first and second resist layers to define electrically-conductive leads which have mutually opposed lateral surfaces extending between the opposed first and second surfaces;
   selectively removing the patterned first resist layer from the first surface while leaving the patterned second resist layer in place directly on the second surface;
   depositing a layer of electrically insulating material directly on the first surface and the mutually opposed lateral surfaces, but not on the second surface covered by the patterned second resist layer; and
   selectively removing the patterned second resist layer from the second surface so that the second surface of each electrically-conductive lead is uncovered.

6. The method of claim 5, wherein the electrically-insulating material comprises a material selected from the group consisting of: a copper oxide material, a benzotriazoles-based material, an imidazoles-based material, a benzimidazoles-based material, and a silicon-based material.

7. The method of claim 5, wherein depositing comprises dipping the etched metal layer with the patterned second resist layer in a bath of electrically-insulating material.

\* \* \* \* \*